(12) United States Patent
Chen

(10) Patent No.: US 10,297,566 B2
(45) Date of Patent: May 21, 2019

(54) SEMICONDUCTOR STRUCTURE AND MANUFACTURING METHOD THEREOF

(71) Applicant: Winbond Electronics Corp., Taichung (TW)

(72) Inventor: Yu-Ming Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/867,715

(22) Filed: Jan. 11, 2018

(65) Prior Publication Data

US 2018/0211931 A1     Jul. 26, 2018

(30) Foreign Application Priority Data

Jan. 25, 2017  (CN) .......................... 2017 1 0060906

(51) Int. Cl.
| | | |
|---|---|---|
| *H01L 23/14* | (2006.01) | |
| *H01L 23/00* | (2006.01) | |
| *H01L 25/065* | (2006.01) | |
| *H01R 4/2407* | (2018.01) | |
| *H01R 12/62* | (2011.01) | |
| *H01L 23/498* | (2006.01) | |

(52) U.S. Cl.
CPC .......... *H01L 24/50* (2013.01); *H01L 23/4985* (2013.01); *H01L 24/13* (2013.01); *H01L 25/0657* (2013.01); *H01R 4/2407* (2018.01); *H01R 12/62* (2013.01); *H01L 2224/13016* (2013.01); *H01L 2224/13124* (2013.01); *H01L 2224/13139* (2013.01); *H01L 2225/06562* (2013.01); *H01L 2225/06579* (2013.01)

(58) Field of Classification Search
CPC ..... H01L 24/50; H01L 24/13; H01L 25/0657; H01R 4/2407
USPC .......................................... 257/702, 688, 737
See application file for complete search history.

(56) References Cited

U.S. PATENT DOCUMENTS

| | | | |
|---|---|---|---|
| 5,789,815 A | 8/1998 | Tessier et al. | |
| 5,834,338 A * | 11/1998 | Takeda ................ | H01L 23/3107 438/123 |
| 6,740,962 B1 * | 5/2004 | Grigg .................. | G03F 7/70416 257/678 |
| 8,597,979 B1 * | 12/2013 | Burgyan ............. | H01L 23/3121 257/686 |
| 2002/0024146 A1 | 2/2002 | Furusawa | |
| 2002/0114143 A1 * | 8/2002 | Morrison ............ | H01L 23/3114 361/749 |
| 2003/0132027 A1 | 7/2003 | Maruyama et al. | |

(Continued)

FOREIGN PATENT DOCUMENTS

| | | |
|---|---|---|
| CN | 101752339 | 6/2010 |
| TW | I394219 | 4/2013 |

*Primary Examiner* — Nitin Parekh
(74) *Attorney, Agent, or Firm* — JCIPRNET

(57) ABSTRACT

A semiconductor structure includes a substrate, a chip, a plurality of conductive bumps, a flexible printed circuit (FPC) board and a plurality of circuit patterns. The chip is disposed on the substrate and includes a plurality of pads. The conductive bumps are disposed on the pads respectively. The FPC board is connected between the substrate and the chip, and the conductive bumps penetrate through an end of the FPC board. The circuit patterns are disposed on the FPC board and electrically connected to the conductive bumps and the substrate.

4 Claims, 4 Drawing Sheets

(56) References Cited

U.S. PATENT DOCUMENTS

| | | | | |
|---|---|---|---|---|
| 2003/0141596 A1* | 7/2003 | Nakamura | .......... | H01L 21/4846 257/758 |
| 2005/0258519 A1* | 11/2005 | Kikuchi | .................. | H01L 23/16 257/666 |
| 2007/0103412 A1* | 5/2007 | Tang | .................... | G09G 3/3685 345/87 |
| 2009/0096080 A1* | 4/2009 | Mikami | .................. | H01L 24/50 257/690 |
| 2014/0085317 A1* | 3/2014 | Lavery | .................. | B81B 7/0006 345/501 |
| 2014/0179127 A1* | 6/2014 | Denis | .................. | H05K 1/0237 439/43 |
| 2015/0076661 A1 | 3/2015 | Musk | | |
| 2015/0294951 A1* | 10/2015 | Smits | ........................ | C09J 5/06 438/119 |

* cited by examiner

SEMICONDUCTOR STRUCTURE AND MANUFACTURING METHOD THEREOF

CROSS-REFERENCE TO RELATED APPLICATION

This application claims the priority benefit of China application serial no. 201710060906.6, filed on Jan. 25, 2017. The entirety of the above-mentioned patent application is hereby incorporated by reference herein and made a part of this specification.

BACKGROUND

Technical Field

The present disclosure generally relates to a semiconductor structure and manufacturing method thereof. More particularly, the present disclosure relates to a semiconductor structure and manufacturing method thereof with higher yield.

Description of Related Art

In an information-explosion world, ICs are widely used in the daily life, including entertainment, education, transportation and households. With the rapid progress in electronic technologies, more personalized and functionally powerful electronic products are out in the market. In general, an electronic product controls its own operation through at least one chip, and the chip may be electrically connected to a substrate or a lead frame by a wire-bonding method, a flip-chip bonding method, a tape-automated bonding (TAB) method, etc.

Regarding the wire-bonding process, the wire-bonding device is configured to, for example, connect the contacts of the substrate and the pads of the semiconductor chip with fine metal wires. The wire-bonding process may be performed in the following manners. Namely, a metal wire is descended with the wire-bonding device. Then, the tip of the device presses an end of the metal wire against the contact while an ultrasonic vibration is applied to bond the metal wire and the contact together, so as to form a first bond. After the first bond is formed, the device is lifted to be moved to a position being above the pad such that the metal wire is extended to form a proper loop from the contacts to the pad. When arriving the position above the pad, the metal wire is descended by the device. Then, the tip of the device presses the metal wire against the pad while the ultrasonic vibration is applied to bond the metal wire and the pad together, so as to form a second bond. After the second bond is formed, a wire damper stops the metal wire from moving while the device is lifted so as to cut off the metal wire at the second bond. The foregoing operations may be repeated to form the connection between the contacts of the substrate and the pads of the semiconductor chip. In addition, a heating process may be performed during the formation of the first bond and the second bond. Moreover, the first bond may be performed on the pads and the second bond may be performed on the contacts.

However, there are still problems in the conventional wire-bonding technique. For example, a short circuit may occur between adjacent metal wires which are intended to be isolated, and an open circuit may abnormally occur in one metal wire or between more metal wires which are intended to be connected to each other. For example, movement of the metal wires during manufacturing process such as sway, sweep, etc., may lead to short circuit between the adjacent metal wires which are intended to be isolated. More severely, such movement of the metal wires may cause breakage of one metal wire or breakage of the connections between metal wires, and further lead to unintended open circuit. Moreover, there are plenty of types of products made by semiconductor manufacturing process, and the quantity of the wires and the shapes of the semiconductor for connection are different from product to product. Therefore, in the conventional wire-bonding technique, it is required to prepare specific wire-bonding tools and wire-bonding platforms for different products, which lead to problems of increased cost, time consumption while changing the wire-bonding tools and the wire-bonding platforms to be installed on the apparatus costing more time, and complicated in managing the wire-bonding tools and the wire-bonding platforms, etc.

SUMMARY

Accordingly, the present disclosure is directed to a semiconductor structure and manufacturing method thereof, which are able to simplify the manufacturing process, improve yield and further reduce the production cost.

The present disclosure provides a semiconductor structure including a substrate a first chip, a plurality of first conductive bumps, a first flexible printed circuit (FPC) board and a plurality of first circuit patterns. The first chip is disposed on the substrate and includes a plurality of first pads. The first conductive bumps are disposed on the first pads respectively. The first FPC board connecting between the substrate and the first chip. The first conductive bumps penetrate through a first end of the first FPC board. The first circuit patterns are disposed on the first FPC board and electrically connect the first conductive bumps and the substrate.

The present disclosure provides a manufacturing method of a semiconductor structure. The method includes the following steps. A substrate is provided. A first chip is disposed on the substrate, wherein the first chip includes a plurality of first pads. A plurality of first conductive bumps are formed on the first pads by a three-dimensional (3-D) printing technique. A thermal lamination process is performed to connect the substrate and the first chip by a first FPC board, wherein the first conductive bumps penetrate through the first FPC board to be electrically connected to the substrate through the first FPC board.

In light of the foregoing, the present disclosure adopts the 3-D printing technique to form a plurality of conductive bumps on the chip and the substrate respectively. Then, a FPC board is configured to connect between the chip and the substrate, such that the conductive bumps on the chip and the substrate penetrate through two opposite ends of the FPC board respectively to electrically connect the chip and the substrate through the FPC board. With such configuration, the electrical connection between the chip and the substrate may be established without the conventional wire-bonding process, so as to avoid the problem of short circuit easily occurring between adjacent metal wires in the conventional wire-bonding process, and save the production cost of specific wire-bonding tools and wire-bonding platforms. Therefore, the semiconductor structure and manufacturing method thereof in the present disclosure may effectively improve yield rate, simplify manufacturing process and further reduce the production cost.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

The present disclosure will now be described more fully with reference to the accompanying drawings, in which exemplary embodiments of the disclosure are shown. The terms used herein such as "above", "below", "front", "back", "left" and "right" are for the purpose of describing directions in the figures only and are not intended to be limiting of the disclosure. Moreover, in the following embodiments, the same or similar devices are denoted by the same or similar referential numbers.

Figure 1:
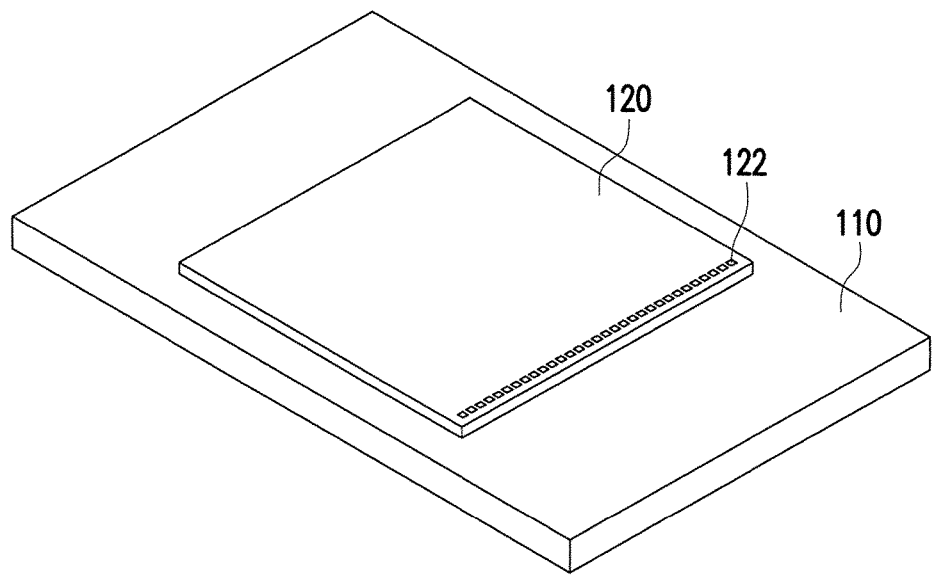
FIG. 1 to FIG. 7 illustrates a manufacturing process of a semiconductor structure according to an embodiment of the present disclosure.

FIG. 1 to FIG. 7 illustrates a manufacturing process of a semiconductor structure according to an embodiment of the present disclosure. In the present embodiment, the manufacturing method of the semiconductor structure 100 includes the following steps. First, a substrate as shown in FIG. 1 is provided. Next, a first chip 120 is disposed on the substrate 110. In the present embodiment, the first chip 120 may be obtained by dicing a wafer having a plurality of chips. The first chip 120 includes a plurality of first pads 122, an active surface and a back surface opposite to the active surface. The first pads 122 is disposed on the active surface, and the first chip 120 is disposed on the substrate 110 via the back surface of the first chip 120.

Figure 2:
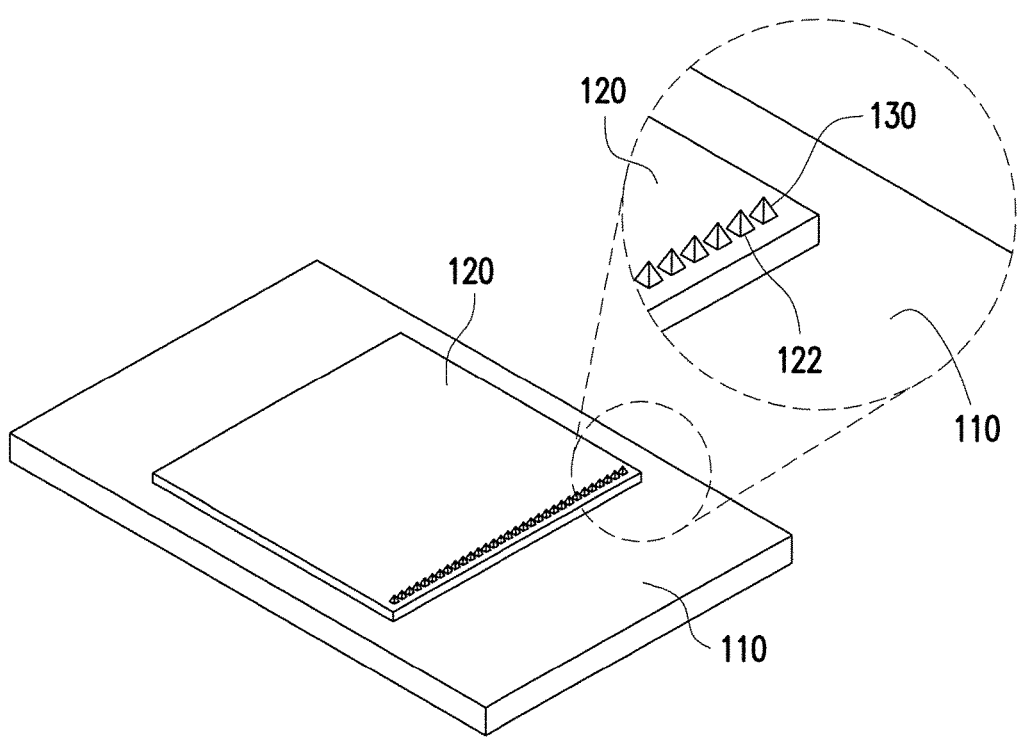

Next, referring to FIG. 2, a plurality of first conductive bumps 130 are formed on the first pads 122 by a three-dimensional (3-D) printing technique. In detail, the present embodiment may print out the first conductive bumps 130 as shown in FIG. 2 according to a digital 3-D model of the first conductive bump 130 by a 3-D printing device. The 3-D printing technique of the present embodiment may include fused filament fabrication (FFF), stereo-lithography, melted and extrusion modelling, electron beam modelling, or other suitable 3-D printing techniques. The disclosure is not limited thereto.

In the present embodiment, each of the first conductive bumps 130 may substantially be a taper-shaped conductive bump as shown in the partially enlarged view of FIG. 2. Each of the first conductive bumps 130 includes a tip, and a material of each of the first conductive bumps 130 includes silver alloy or aluminum alloy. In the present embodiment, the digital 3-D model of the first conductive bump 130 may be a digital 3-D image file, which may be built by computer-aided design (CAD) or animation and modelling software, etc. The digital 3-D model is sliced into a plurality of cross-sections for the 3-D printing device to read and print the building material by layers on the print bed of the 3-D printing device according to the cross-sections of the digital 3-D model to form a plurality of stacking layers. The stacking layers stacked on top of each other to form the first conductive bump 130. That is to say, the first conductive bump 130 formed by 3-D printing technique may include a plurality of stacking layers stacked on top of each other. Certainly, the disclosure is not limited thereto. In addition, after the first conductive bumps is printed, a curing process may be optionally performed to cure the first conductive bumps 130 and enhance the stiffness of the first conductive bumps 130.

Figure 3:
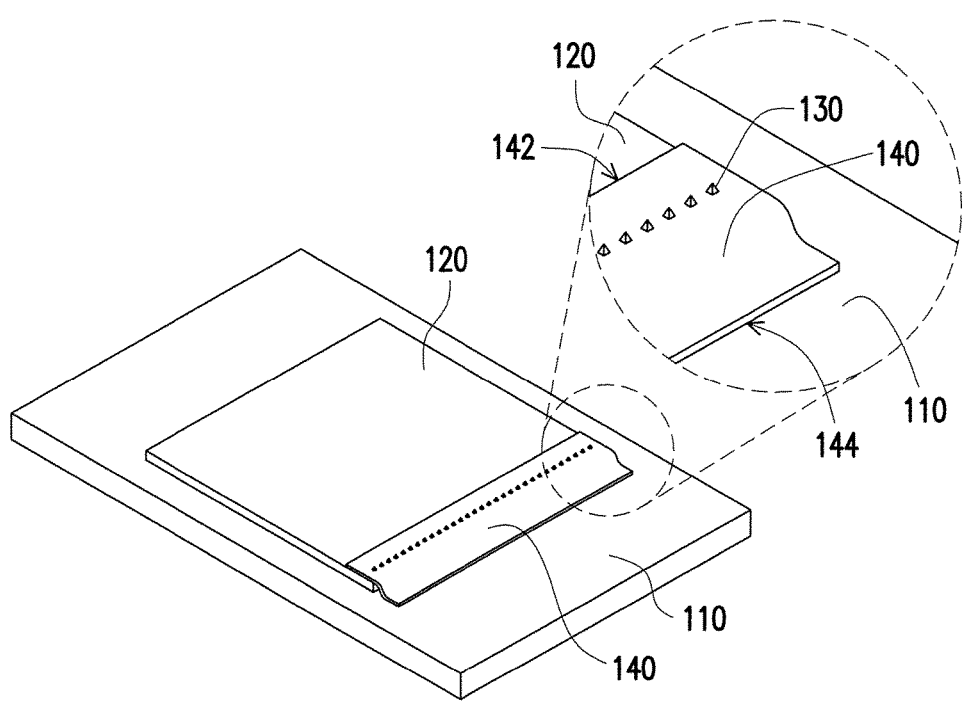

Next, referring to FIG. 3, a thermal lamination is performed to connect the substrate 110 and the first chip 120 by a first FPC board 140, wherein the tips of the tapered-shaped first conductive bumps 130 penetrate through a first end 142 of the first FPC board 140 to be electrically connected to the substrate 110 through the first FPC board 140. In detail, in the present embodiment, a lamination adhesive may be disposed on two opposite ends of the first FPC board 140, and then the thermal lamination is performed to laminate the two opposite ends of the first FPC board 140 on the first chip 120 and the substrate 110 respectively. In detail, the lamination adhesive may be disposed between the first FPC board 140 and the first chip 120 and between the first FPC board 140 and the substrate 110.

Figure 4:
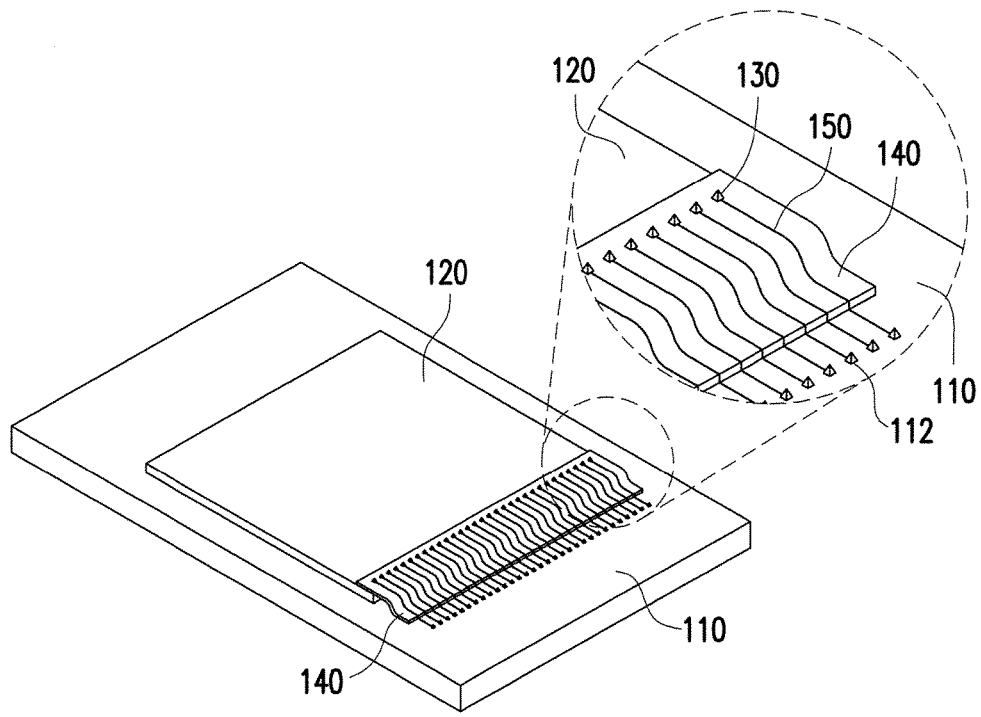

Referring to FIG. 4, in the present embodiment, a plurality of first circuit patterns 150 and a plurality of substrate conductive bumps 112 are formed by the 3-D printing technique, wherein the substrate conductive bumps 112 are printed on the substrate 110, and the first circuit patterns 150 is printed on the first FPC board 140 and the substrate 110 and contacts with the first conductive bumps 130 and the substrate conductive bumps 112 to electrically connect the first conductive bumps 130 and the substrate 110.

Figure 5:
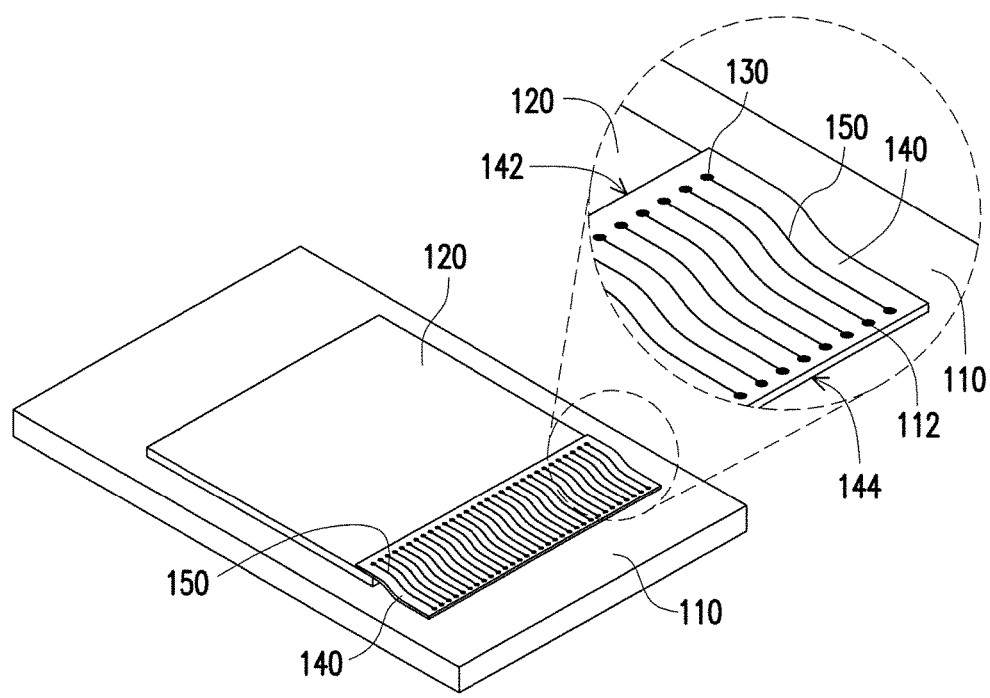

In addition, in another embodiment, the method of electrically connecting the first conductive bumps 130 and the substrate 110 through the first FPC board 140 may also be shown in FIG. 5. A plurality of first circuit patterns 150 may be pre-printed on the first FPC board 140 by the 3-D printing technique, and a plurality of substrate conductive bumps 112 are formed on the substrate 110 by the 3-D printing technique, such that, when the thermal lamination is performed on the first FPC board 140, the taper-shaped substrate conductive bumps 112 penetrate through a second end 144, which is opposite to the first end 142, of the first FPC board 140 and electrically connect the first circuit patterns 150 on the first FPC board 140. In the present embodiment, the substrate conductive bumps 112 may be in a taper shape as the first conductive bumps 130 is. Accordingly, the tip of the taper-shaped first conductive bump 130 penetrates through an end of the first circuit pattern 150, and the tip of the taper-shaped substrate conductive bump 112 penetrates through another end of the first circuit pattern 150, such that the first conductive bumps 130 are electrically connected to the substrate conductive bump 112 through the first circuit patterns 150 of the first FPC board 140. Accordingly, the manufacturing process of the semiconductor structure in the present embodiment may be substantially done.

Figure 6:
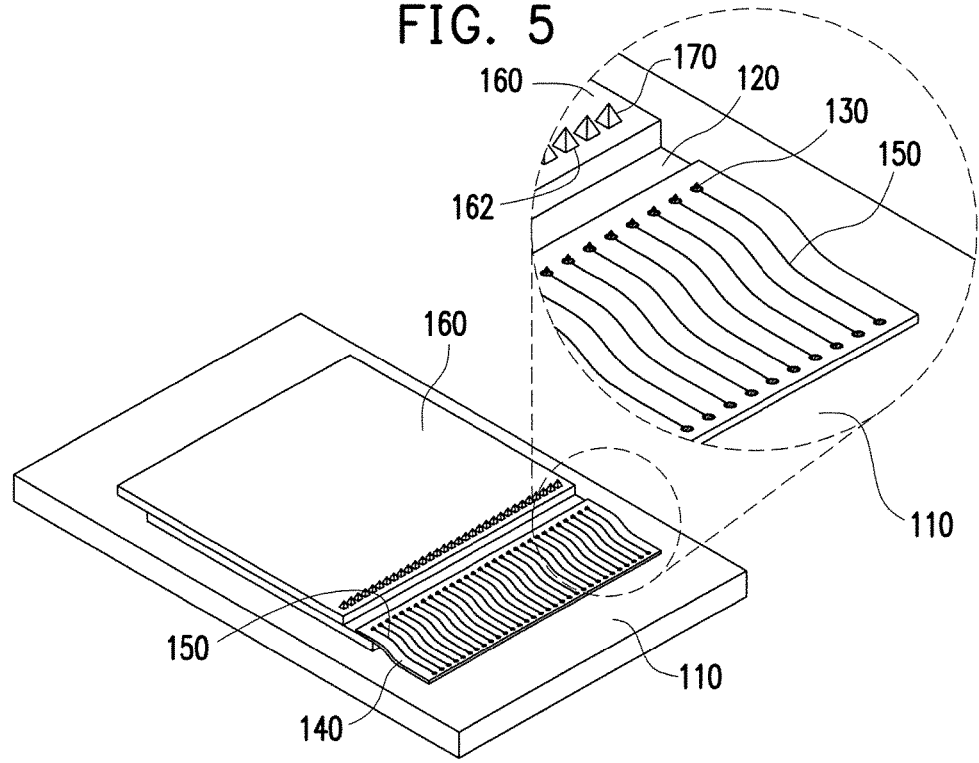
Figure 7:
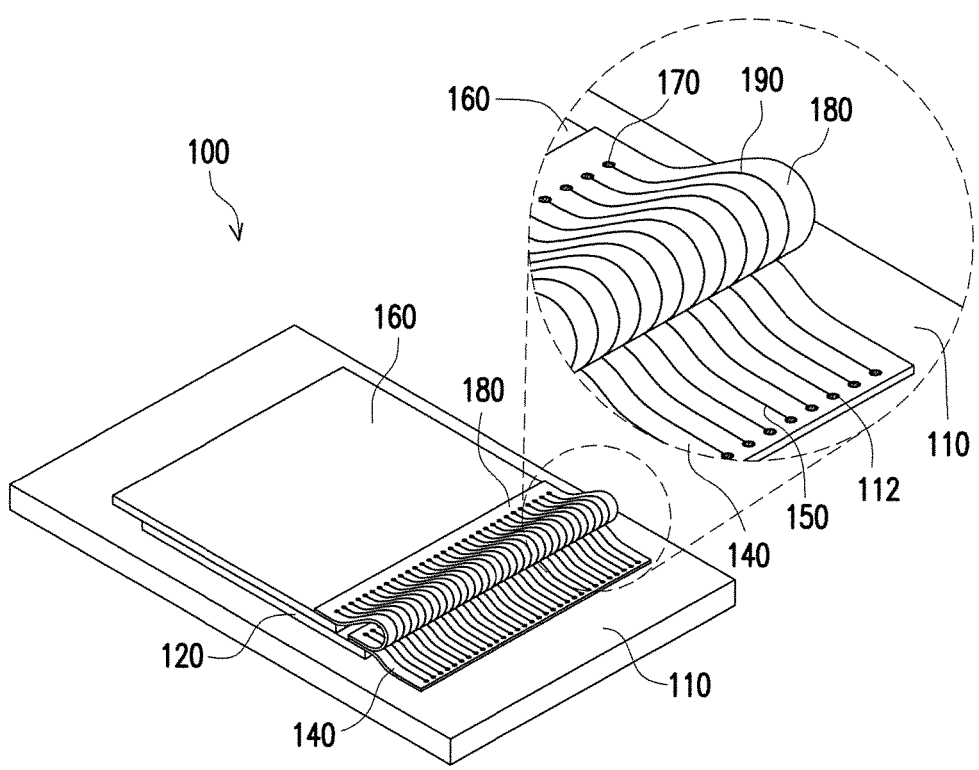

In the present embodiment, the manufacturing method of the semiconductor structure may further continue to perform the following steps. Referring to FIG. 6, a second chip 160 is stacked on the first chip 120 without covering the first conductive bumps 130. The second chip 160 may include a plurality of second pads 162, an active surface and a back surface opposite to the active surface. The second pads 162 are disposed on the active surface of the second chip 160, and the second chip 160 is disposed on the first chip 120 via the back surface of the second chip 160. Next, a plurality of second conductive bumps 170 are formed on the second pads 162 of the second chip 160 respectively by the 3-D printing technique. The second conductive bump 170 may also be in a taper shape as the first conductive bump 130 is. Next, referring to FIG. 7, the first chip 120 and the second chip 160 are electrically connected by a second FPC board 180. In detail, in the present embodiment, a plurality of second circuit patterns 190 may be pre-printed on the second FPC board 180 by 3-D printing technique. Accordingly, when the second FPC board 180 is connected between the first chip 120 and the second chip 160, the first conductive bumps 130 and the second conductive bumps 170 may penetrate through two opposite ends of the second FPC board 180 respectively, and penetrate through the second circuit patterns 190 of the second FPC board 180 respectively, so as to electrically connect the first conductive bumps 130 and the second conductive bumps 180 through the second circuit patterns 190 of the second FPC board 180. As such, the manufacturing process of the semiconductor structure 100 of the present embodiment may be substantially done.

In sum, the present disclosure adopts the 3-D printing technique to form a plurality of conductive bumps on the chip and the substrate respectively. Then, a FPC board is configured to connect between the chip and the substrate, such that the conductive bumps on the chip and the substrate penetrate through two opposite ends of the FPC board respectively, so as to electrically connect the chip and the substrate through the FPC board.

With such configuration, the disclosure utilizes the flexibility of the FPC board to form the electrical connection between the chip and the substrate and/or between the chips, so the conventional wire-bonding process may be omitted, so as to avoid the problem of short circuit easily occurring between adjacent metal wires in the conventional wire-bonding process, and save the production cost of specific wire-bonding tools and wire-bonding platforms. Therefore, the semiconductor structure and manufacturing method thereof in the present disclosure may effectively improve yield rate, simplify manufacturing process and further reduce the production cost.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A manufacturing method of a semiconductor structure, comprising:
   providing a substrate;
   disposing a first chip on the substrate, wherein the first chip comprises a plurality of first pads;
   forming a plurality of first conductive bumps on the plurality of first pads by a three-dimensional (3-D) printing technique; and
   performing a thermal lamination process to connect the substrate and the first chip by a first flexible printed circuit (FPC) board at opposing ends thereof, wherein the plurality of first conductive bumps penetrate through the first FPC board to electrically connect the plurality of first conductive bumps to a plurality of substrate conductive bumps respectively through the first FPC board.

2. The manufacturing method of the semiconductor structure as claimed in claim 1, further comprising:
   forming a plurality of first circuit patterns and the plurality of substrate conductive bumps by the three-dimensional (3-D) printing technique, wherein the plurality of first circuit patterns are extended from the first FPC board onto the substrate, so as to electrically connect the plurality of first conductive bumps and the plurality of substrate conductive bumps on the substrate respectively.

3. The manufacturing method of the semiconductor structure as claimed in claim 1, further comprising:
   forming the plurality of substrate conductive bumps on the substrate by the 3-D printing technique, wherein when the first FPC board is connected between the substrate and the first chip, the plurality of substrate conductive bumps penetrate through the first FPC board and electrically connect a plurality of first circuit patterns on the first FPC board respectively.

4. The manufacturing method of the semiconductor structure as claimed in claim 1, further comprising:
   stacking a second chip on the first chip without covering the plurality of first conductive bumps;
   forming a plurality of second conductive bumps on a plurality of second pads of the second chip respectively by the 3-D printing technique; and
   connecting the first chip and the second chip by a second FPC board, wherein the second FPC board comprises a plurality of second circuit patterns formed by the 3-D printing technique, the plurality of first conductive bumps and the plurality of second conductive bumps penetrate through two opposite ends of the second FPC board respectively, so as to electrically connect the plurality of first conductive bumps and the plurality of second conductive bumps through the plurality of second circuit patterns.

* * * * *